United States Patent [19]
Rees et al.

[11] Patent Number: 5,126,950
[45] Date of Patent: Jun. 30, 1992

[54] SYNCHRONOUS ARRAY LOGIC CIRCUITRY AND SYSTEMS

[75] Inventors: David B. Rees, Crowthorne; Avi S. Bahra, Reading; David Cooke, Mortimer; Jaspal S. Gill, Reading; Michael J. Glennon, Reading; John A. Hesketh, Reading; Alison C. McVicar, Crowthorne; Nigel K. Ross, Wokingham; Keith W. Turnbull; Robert G. Warren, both of Reading, all of United Kingdom

[73] Assignee: National Semiconductor Corporation, Santa Clara, Calif.

[21] Appl. No.: 465,558

[22] Filed: Jan. 16, 1990

Related U.S. Application Data

[63] Continuation of Ser. No. 919,924, Oct. 16, 1986, abandoned.

[51] Int. Cl.$^5$ .............................................. G06F 15/60
[52] U.S. Cl. ..................................... 364/490; 364/489; 364/488
[58] Field of Search ............... 364/488, 489, 490, 491, 364/578, 579, 510; 371/25.1, 22.1; 324/73.1

[56] References Cited

U.S. PATENT DOCUMENTS

| | | | |
|---|---|---|---|
| 3,783,254 | 1/1974 | Eichelberger | 364/700 |
| 3,806,891 | 4/1974 | Eichelberger et al. | 364/900 |
| 4,298,980 | 11/1981 | Hajdu et al. | 371/25 |
| 4,476,431 | 10/1984 | Blum | 371/25 |
| 4,513,418 | 4/1985 | Bardell, Jr. et al. | 371/25 |
| 4,667,325 | 5/1987 | Kitano et al. | 371/25 |
| 4,672,610 | 6/1987 | Salick | 371/25 |
| 4,697,267 | 9/1987 | Wakai | 371/25 |
| 4,701,920 | 10/1987 | Resnick et al. | 371/25 |
| 4,701,922 | 10/1987 | Kuboki et al. | 371/25 |
| 4,703,484 | 10/1987 | Rolfe et al. | 371/25 |

OTHER PUBLICATIONS

T. C. Lo, "LSSD Implemented With DCVS Logic", IBM Tech. Discl. Bulletin, vol. 26, No. 11, Apr. 1984, pp. 5805-5810.

*Primary Examiner*—Parshotam S. Lall
*Assistant Examiner*—V. N. Trans
*Attorney, Agent, or Firm*—Townsend and Townsend

[57] ABSTRACT

Synchronous array logic circuitry and a system for automatically laying out such circuitry for the fabrication of integrated circuits are described. The synchronous array logic circuitry includes as many cells as necessary to perform the desired functions with each cell including a transistor array for evaluating a Boolean function and supplying the result to a storage element through a multiplexer. The storage element latches the output signal and supplies it to other transistor arrays and/or other cells. The transistor array includes serially connected transistors for performing AND functions and parallel connected transistors for performing OR functions. The multiplexer operates under control of a test signal to configure the storage elements serially, thereby enabling complete testability of all cells.

25 Claims, 5 Drawing Sheets

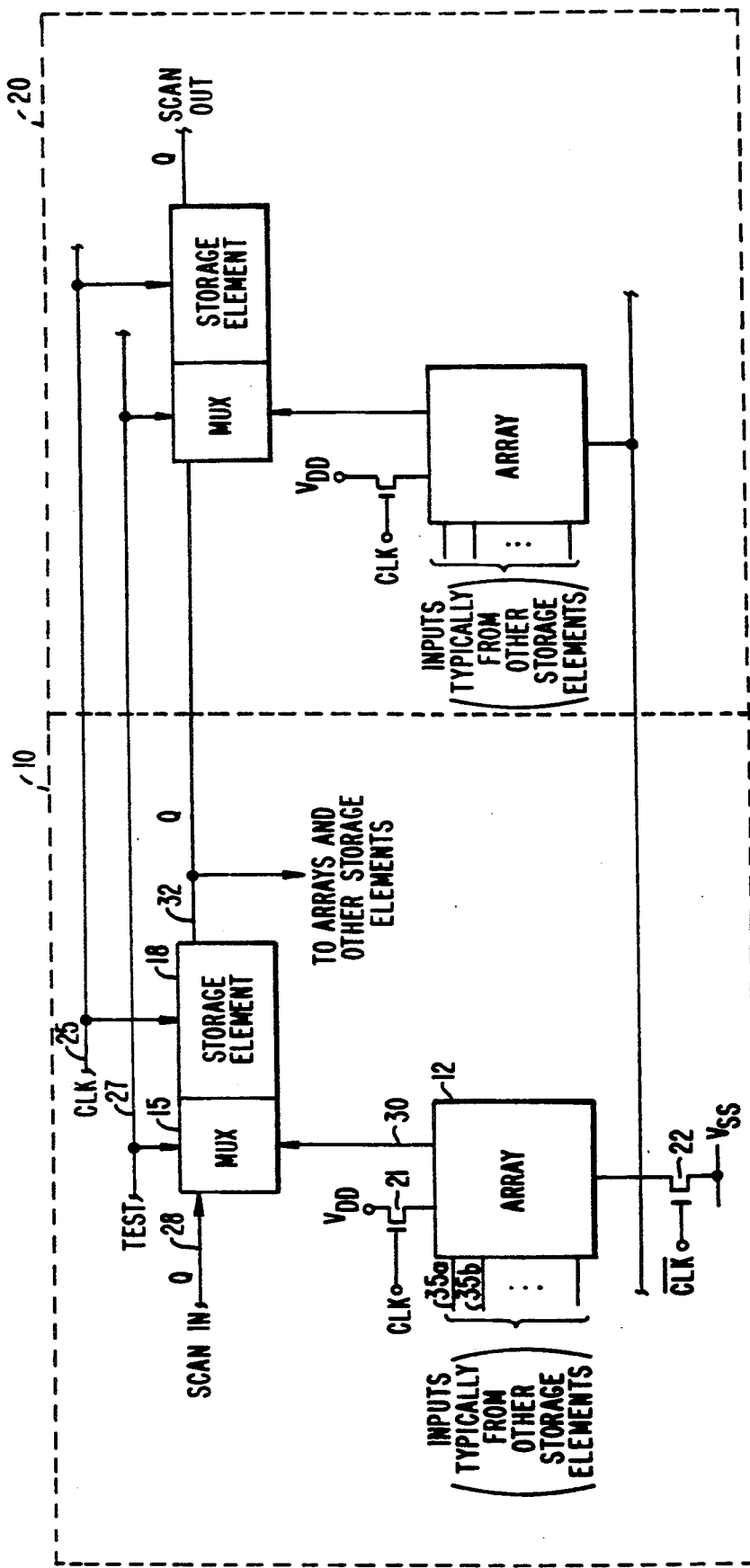
FIG.—1.

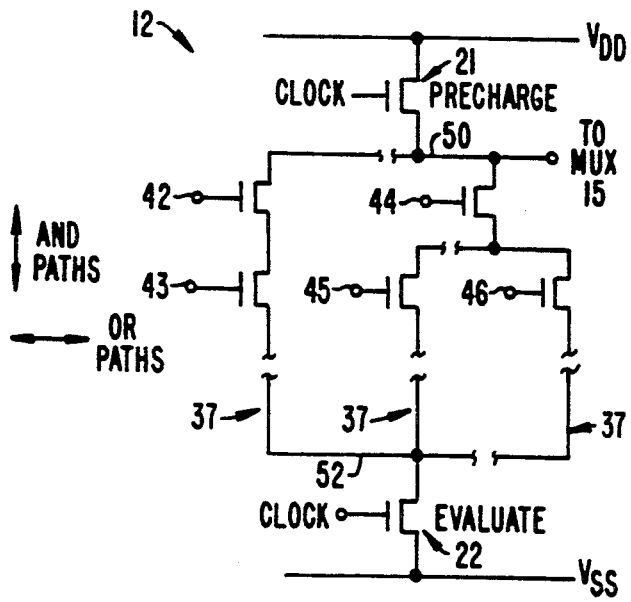
FIG._2.
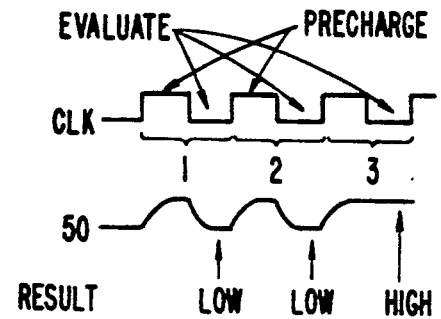
FIG._3.
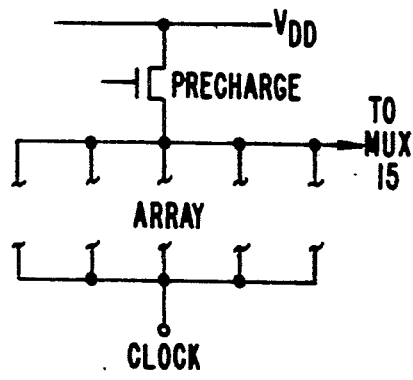
FIG._4.
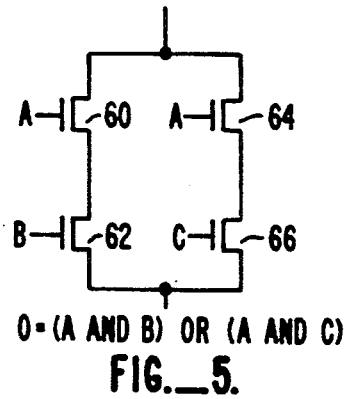
O = (A AND B) OR (A AND C)
FIG._5.
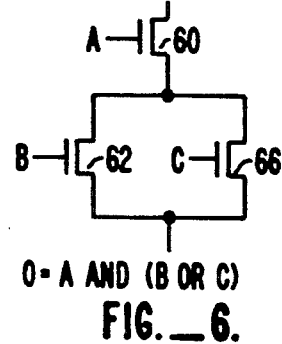
O = A AND (B OR C)
FIG._6.

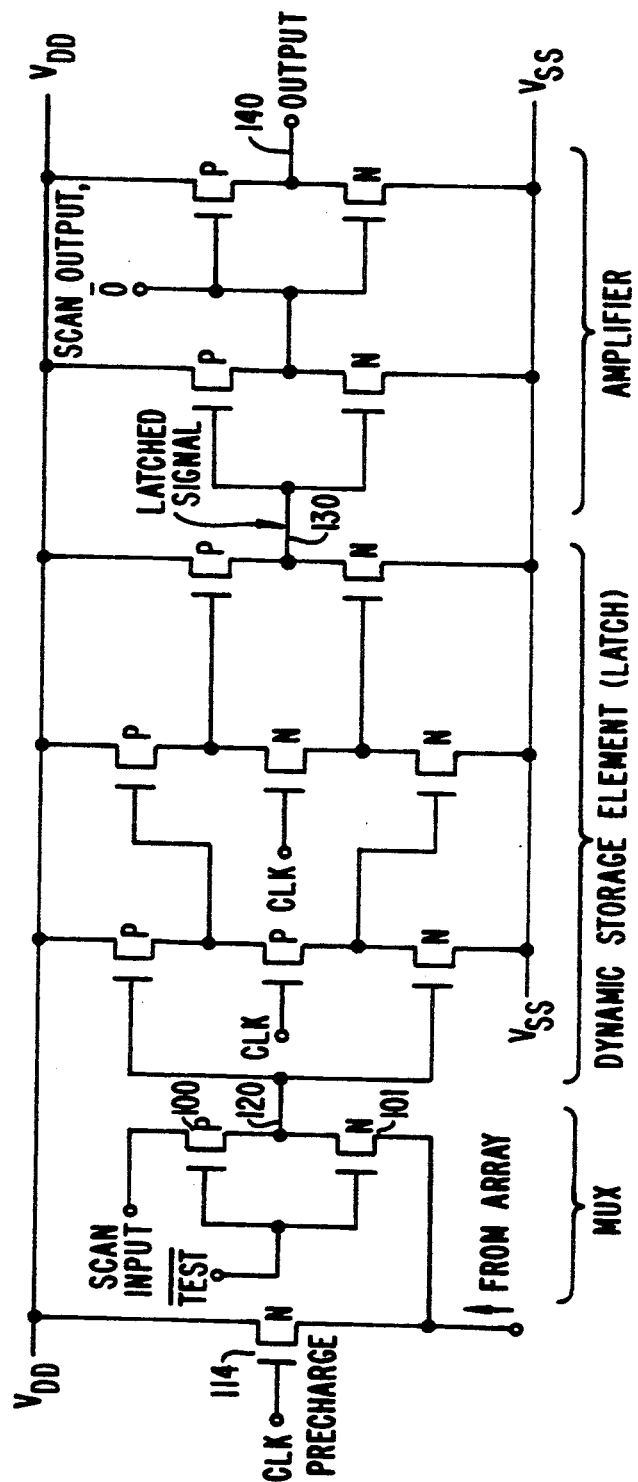
FIG._7.

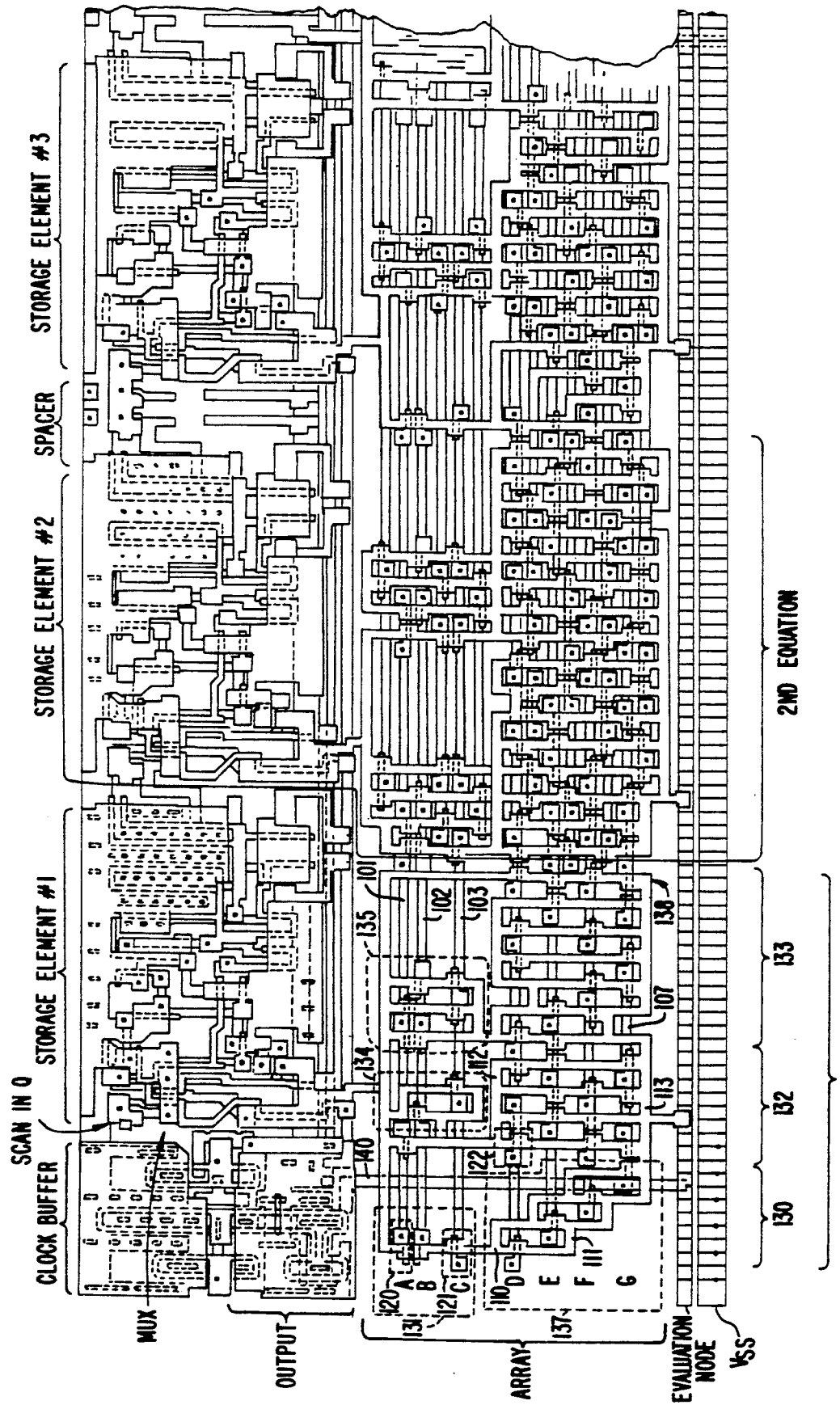
FIG._8.

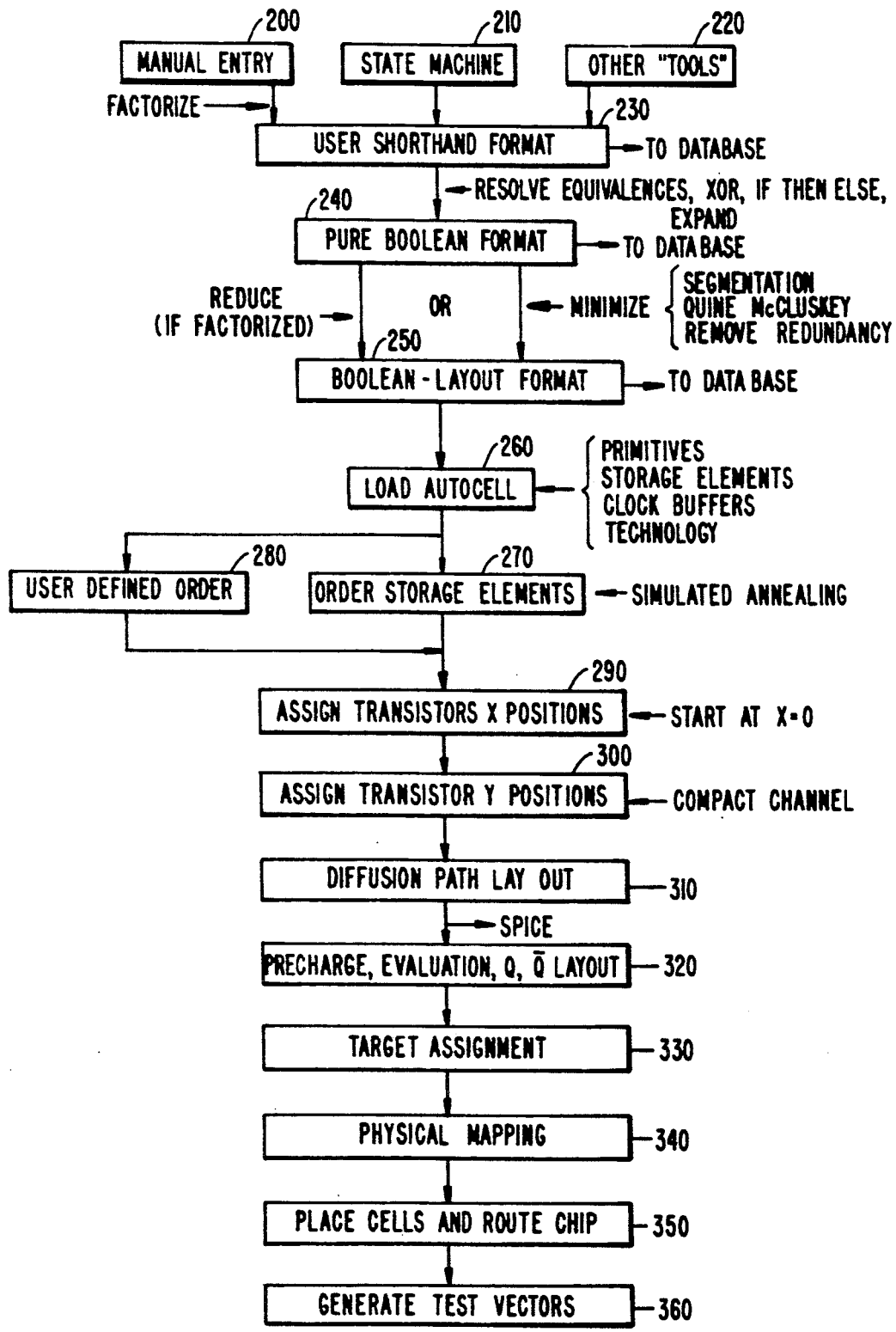
FIG._9.

SYNCHRONOUS ARRAY LOGIC CIRCUITRY AND SYSTEMS

This is a continuation of application Ser. No. 06/919,924, filed Oct. 16, 1986, now abandoned.

BACKGROUND OF THE INVENTION

1. Field of the Invention

This invention relates to a system for automatically generating masks for the fabrication of integrated circuits for performing Boolean and other logic functions using only equations or other high level information supplied to the system by the user, and to such circuitry.

2. Description of the Prior Art

The manufacture of very large scale integrated circuits is now achieved using a variety of techniques. At one extreme are custom designs, wherein each component incorporated on the integrated circuit "chip" is manually chosen and its position on the to-be-fabricated chip decided. At the other end of the spectrum are gate arrays in which all of the logic elements are formed and placed on the chip before the function to be performed by the chip is known. Then, using a computer-aided design system, a user, with the assistance of the chip manufacturer, creates a mask to define an interconnection pattern for the gates to create the desired logic functions.

From a designer's point of view, the design of custom very large integrated circuits presents several problems caused by the magnitude of the task. First, many man-years are often required to design and lay out a large chip. Typical productivity for such fully custom designs is only about one to ten gates per man-week. Furthermore, substantial engineering costs must be assessed to customers of custom layouts for customer support and for the cost of computer time used. The custom nature of the process results in such costs being comparably high. Secondly, as integrated circuits become more complex, increasing amounts of computer resources must be expended on ever more powerful and expensive computers for simulation, layout, and the like. Additionally, enormous amounts of effort are required to prepare computer programs to control the automatic test systems used to verify the proper functionality of the completed chips. Another difficulty with custom layouts is the occasional iandvertent requirement for the silicon structure to operate near the process limits. This is an undesirable occurrence because of the substantial limitation it places on manufacturing yields.

In view of these difficulties, many approaches have been tried to automate the design of integrated circuits. For example, standard cells and gate array systems are employed for capturing a logic schematic and implementing it in silicon. For complex functions, however, much of the design effort is involved in creating the logic schematic, which still must be prepared manually. Furthermore, gate arrays and standard cells generally are relatively inefficient at using the silicon area. The use of all of the gates defined on the chip is extremely unlikely, and typical designs often use three-fourths or fewer of the gates. As a result, the manufacturing costs for the chip are unnecessarily high, in that the silicon area must be allocated to functions which are not employed in the final design. It is well known that increasing chip area decreases yields and increases cost.

SUMMARY OF THE INVENTION

A need exists for a system and circuitry which may be automatically designed and defined into an integrated circuit in a manner which is least labor-intensive to the designer, yet which uses only as much silicon area as the logic functions to be implemented require. In this manner an efficient completed circuit may be developed and fabricated, while avoiding the design delays inherent in custom layouts and the inefficiency inherent in gate arrays and standard cells.

We have developed a system in which the direct link between the designer's architecture and the layout architecture is removed. In our system the layout software operates from the same netlist as is employed for proving the design, but our system repartitions the design from the bottom up to obtain the best speed and smallest die area. This optimization is hidden from the designer who only needs to specify the overall functionality and speed desired for the to-be-fabricated circuit. The system then accepts the designer's functional description and produces masks for the manufacture of an integrated circuit, while providing warnings to the designer if he attempts to exceed the capabilities of the system. Circuits designed using our system are synchronous to eliminate race hazards. Because the description of the behavior of the circuit to be designed is mathematical, the designer's logic may be transformed by the system to achieve the required functionality in the most efficient manner possible. This provides speed benefits while reducing the overall size of the chip.

In our preferred embodiment, our system is based upon "pseudo-CMOS" technology which allows removal of almost all of the complementary P-channel transistors, one of which is usually required for each N-channel transistor. The logic functions to be performed are provided by arrays of transistors. Each function implemented using our system is termed a cell, and as many cells as are necessary (and will fit on a chip) may be employed. Because cells implementing given functions are created by a computer using the interconnect information, the cells may be fabricated in a dense and efficient manner. As a result, chips manufactured using our technique have densities as much as seven times greater than gate arrays and standard cells. The resulting circuit is completely testable and without redundancy.

Our system provides a customized integrated circuit in the sense that every transistor on the circuit is specifically needed and there is no redundancy in the silicon or in the logic. On the other hand, the topology of the entire integrated circuit is laid out by the computer, thereby enabling the design and manufacture of large circuits quickly. For example, given the Boolean equations, the masks for an adder may be designed in a few hours. Our system enables the circuit designer to ignore testability because our system automatically configures the circuit to be testable, and the system automatically generates the test program. The chip performance may be assured by a worst case pre-characterization simulation of all of the elements in the circuit.

In one embodiment, a circuit fabricated using our system includes a source of clock signals; a first, second, and third scan node; a first storage element connected to receive the clock signals and connected to the second scan node; a second storage element connected to receive the clock signals and connected to the third scan node; first and second transistor arrays, having first and second input nodes and first and second output nodes, respectively; a test node for supplying a test signal; first switching means connected between the first scan node and the first storage element, and connected to each of the test node, the first scan node and the first output node for connecting one of the first scan node or the first output node to the first storage element in response to the test signal; and second switching means connected between the second scan node and the second storage element, and connected to each of the test nodes, the second scan node and the second output node for connecting one of the second scan node or the second output node to the second storage element in response to the test signal. In the preferred embodiment, the transistor arrays include networks of transistors interconnected in a manner such that transistor sources and drains are connected in one direction to perform AND functions, while transistor gates are connected in a perpendicular direction to perform OR functions.

The method we employ for laying out such a circuit includes the steps of providing a set of Boolean equations defining the function to be performed by the integrated circuit; for each such equation retrieving from a database a set of primitives, including a storage element; ordering the storage elements to minimize layout area; defining for each such equation the positions of the transistors along a first axis; and defining for each such equation the positions of the transistors along a second axis.

BRIEF DESCRIPTION OF THE DRAWINGS

FIG. 1 is a block diagram of a portion of an integrated circuit fabricated employing a preferred embodiment of our circuitry;

FIG. 2 is a schematic illustrating the conceptual layout of transistors within the array shown in FIG. 1;

FIG. 3 is a series of timing diagrams illustrating the operation of the circuit of FIG. 2;

FIG. 4 is a schematic illustrating an alternate conceptual layout for the array of FIG. 1;

FIG. 5 is a schematic illustrating a transistor array implementing a Boolean function;

FIG. 6 is a schematic illustrating the implementation of an equivalent Boolean function using fewer transistors;

FIG. 7 is a schematic illustrating in further detail the multiplexer and storage element shown in FIG. 1;

FIG. 8 is a layout drawing illustrating the implementation in an integrated circuit of several Boolean equations using the system of our invention; and FIG. 9 is a flowchart illustrating a preferred embodiment of the method by which our system operates.

DETAILED DESCRIPTION OF THE PREFERRED EMBODIMENTS

We have developed a system and circuitry for automatically "laying out" integrated circuits given only high level information about their functionality. By layout we are referring to the selection of components and positioning of regions forming those components on the various masks used to fabricate an integrated circuit. For example, such components include transistors interconnected to form a circuit, while such regions include metal lines, doped and undoped regions in the semiconductor material itself, the positioning of transistors, etc. With our system, a designer may specify the overall functionality of the integrated circuit using Boolean equations or other high level description, and the system will provide drawings for the masks to be used to fabricate such a circuit, without further intervention by the designer. To understand our system, we describe below the circuit technology our system employs, and then describe the manner in which the system operates.

Circuit Technology

FIG. 1 is a block diagram illustrating conceptually the manner in which integrated circuits designed using our system are implemented. FIG. 1 is a small portion of a much larger integrated circuit, and illustrates the circuit implementation of two Boolean equations. It will be appreciated that as many such portions as illustrated in FIG. 1 may be combined to produce the overall functionality desired for the integrated circuit.

FIG. 1 includes two cells 10 and 20, each for implementing a single Boolean equation. Cells 10 and 20 are identical to each other at the level of the block diagram, and accordingly only cell 10 is described here. Cell 10 generally includes an array of transistors 12, a multiplexer 15, and a storage element 18. These elements are shown in block form; their components are described in detail below. Storage element 18 implements scan testability and synchronous operation of the cells with each other. Transistor array 12, which provides the means by which the logic function desired from cell 10 is implemented, is switchably connected between a power supply $V_{DD}$ and a lower potential $V_{SS}$ by transistors 21 and 22. Signal lines for a clock signal 25, a test signal 27 and signal Q (28) extend into cell 10 from exterior of the cell. If desired, a signal $\overline{Q}$, the inverse of signal Q, could be supplied instead. Line 28 originates from a cell (not shown) preceding cell 10, or in the case when cell 10 is the first cell, from signals supplied from off the chip. Clock line 25 is driven by a well-known oscillator and is connected to supply a clock signal to storage element 18 and to transistor 21, while its inverse is supplied to transistor 22. For clarity, transistors 21 and 22 are shown outside array 12. In the actual circuitry, however, they are implemented within array 12 or within a clock buffer used to drive the clock lines. Multiplexer 15 is connected to storage element 18 to control the signals supplied to the storage element. Signals on test line 27 control multiplexer 15 and determine whether multiplexer 15 will supply to storage element 18 the signal Q on line 28, or the output signal from transistor array 12 received over line 30.

Cell 10 may be operated in two different modes—normal and test. In normal operation the test line 27 will be off. Array 12, in response to signals supplied to its input nodes 35a, 35b, etc., will evaluate a Boolean equation and supply the result over line 30 to multiplexer 15. Because the test line 27 is off, multiplexer 15 will pass the result of that evaluation to storage element 18, which latches the array output signal, as well as its inverse signal, on output lines 32 and 33. Output line 32 is connected as an input line to the storage element in the next cell 20 and, typically, also provides one or more input signals to transistor arrays in other cells. If feedback is employed in the array 12, line 32 may even be connected to the originating array 12 in the same cell 10.

During testing, the circuit shown within cell 10 in FIG. 1 will be configured in a different manner under control of test line 27. A signal on this line will cause multiplexer 15 to allow the Q signal on line 28 to be supplied directly to storage element 18, ignoring the signal on line 30. In such a configuration a chain of storage elements in adjoining cells is created which acts as a shift register. The shift register allows complete testing of the integrated circuit, including the transistor arrays. Broadly speaking, the test data may be clocked into the circuitry using storage elements in shift register form. Then the system is switched into normal operation for one or more cycles to perform a specified operation. Finally, the system is returned to test mode, and the results of the specified operation clocked out to be compared with the data provided by a properly functioning circuit. This process may be repeated as many times as desired to verify proper functionality of all circuit components. Such test operation is discussed further below.

In our system each transistor array supplies a single storage element, and each group of cells 10, 20, etc., receive the same clock signal. If necessary, a clock buffer circuit is employed to distribute the incoming clock signal to all of the desired storage elements. The clock signal is not restricted in the number of phases it may have, nor is there a restriction on whether the storage elements are dynamic or static.

The essence of the cell 10 is transistor array 12. This transistor array, typically employing only N-channel transistors, performs the logical operation on the input signals 35, while storage element 18 saves the result. The array 12, like the Boolean equation it evaluates, may be of any desired size. The array usually will be in one of several different formats. The general structure of one embodiment of the transistor array 12 is shown in further detail in FIG. 2. The array itself consists of "sticks" of buried diffusion 37 joined at the top and bottom, with the transistors, for example, transistors 42 and 43, on any one stick performing a logical AND function. The joining of the sticks at their tops and bottoms provides the logical OR function. For simple sum of products arrays, the number of sticks determines the width of the array and is equal the number of OR terms in the Boolean equation. The number of transistors in each stick determines the array height and represents the number of AND terms. Although theoretically unlimited, the size of the array actually is limited by circuit performance considerations. Furthermore, as discussed below, the size of the array may be reduced by factorizing.

For the exemplary partial circuit shown in FIG. 2, the lower node 52 will be connected to the upper node 50 if either (1) both transistors 42 and 43 are on or (2) transistor 44 and one of transistors 45 or 46 are on. Thus, the simple circuit shown evaluates the function Output evaluates to zero if transistors 42 and 43 equal one, or if transistor 44 equals one and one of transistors 45 and 46 equals one. The approach shown may be expanded to implement much more complex logic functions as shown in FIG. 8.

The operation of the circuit shown in FIG. 2 is illustrated using timing diagrams in FIG. 3. During the first half clock cycle, while the clock signal Clk is high, the top node 50, and all other nodes connected to it by transistors which are on, are charged to a digital state high. This is the precharge phase. During the next half cycle, the bottom node 52, and all other nodes connected to it by transistors which are off, are discharged to a digital low. This is the evaluation phase. If a conducting path exists through the array from the top to the bottom nodes (i.e., all of the AND transistors in any one OR stick are on), then the top node will also be discharged to low. Upon the next clock edge, that is, immediately before the next precharge, the storage element will read the digital level at the top of the array, detecting whether it is high or low, and latching the result. Thus, using the storage element, the array output is stored and propagated to subsequent cells and arrays, and the array is freed for the next data and the precharge/evaluation cycle. For the hypothetical input data used in FIG. 3, during cycles 1 and 2 a conducting path exists between nodes 50 and 52, and accordingly the node 50 is pulled low. No conducting path exists during cycle 3, and accordingly node 50 remains high.

The precharge and evaluation functions may be carried out in several different ways. One such approach was shown in FIG. 2, wherein each array includes a P-channel precharge transistor and an N-channel evaluation transistor. An alternate approach is shown in FIG. 4. As shown in FIG. 4, each array includes an N-channel precharge transistor and communally uses the clock line as the evaluation node. Apart from lowering the number of transistors required, the approach of FIG. 4 has advantages in layout and routing. Because the clock line goes through each cell (as shown in FIG. 1), the clock line provides an easy linear target at the bottom of the array for automatic routing, unlike an evaluation transistor which is a point target.

An example of "factorizing" to reduce the transistor count of an array is depicted in FIGS. 5 and 6. As shown in FIG. 5, an array includes a first transistor 60 serially connected to a second transistor 62. These serially-connected transistors are themselves connected in parallel with third and fourth transistors 64 and 66. Each of transistors 60 and 64 receives an input signal designated A, while transistor 62 is controlled by signal B and transistor 66 by signal C. Thus, the output will match the input if either A and B or A and C are on. To implement the array in this manner requires four transistors.

FIG. 6 illustrates the concept of factorizing in which transistor 64 has been omitted and transistor 60 serially coupled to the parallel connected transistors 62 and 66. As a result this circuit implements the same function as in FIG. 5 but with one fewer transistor. We employ factorizing to reduce the transistor count, improve speed, reduce load and reduce chip area in large arrays. See, e.g., FIG. 8.

The overall operating speed of the transistor array is limited by the precharge and evaluation times, which in turn are controlled by the loads inside the array to be charged and discharged. Larger arrays tend to operate more slowly than smaller arrays. The performance degrading features of an array are transistor conductivity and parasitic load. The on resistance will represent the conductivity of the transistors. As a result, the more series devices which are present the more capacitance to be charged and discharged and the more resistance for that capacitance to be charged and discharged through. A worst case occurs when only one of the AND paths is conducting and all but the bottom transistor of all other paths are OFF, thereby causing all of the parasitic capacitances to be discharged through a single transistor.

Another factor which affects performance of the transistor array is the length of the interconnect diffusion between the transistors and the array. Longer lines of interconnect have more resistance and more capacitance. Additionally, array performance is affected by the delay between the precharge phase starting and the input signals to the array being valid. This is a result of the delay in signal propagation through the storage elements which causes an increase in the time that the clock must remain in the precharge phase. Accordingly, the maximum clock rate is limited by the sum of signal propagation delay, worst case precharge time, and worst case evaluation time.

FIG. 7 is a detailed schematic of the combination multiplexer 15 and storage element 18 shown in block form in FIG. 1. For illustration, an amplifier stage has been added to the storage element 18 to illustrate one technique for amplifying the output signals from the storage element. Such amplification is necessary when the storage element is driving many other transistor arrays or driving fewer arrays spaced far from the storage element.

The purpose of the storage element is to synchronize the transistor arrays in all of the cells of the integrated circuit, as well as provide a scan path for testing. The storage element stores the result of an evaluation, and amplifies the result for subsequent stages. The output from a transistor array evaluation is stored by the circuit which behaves like an edge-triggered d-type latch. The storage elements themselves may be of dynamic or static design. The dynamic circuits are smaller and faster, while the static circuits provide the opportunity for stopping the system clock.

The central portion of the circuit shown in FIG. 7 and designated "Dynamic Storage Element (Latch)" operates from a single clock signal, is compact for layout, and includes amplification stages. The amplifier circuit on the right side of FIG. 7 is employed to compensate for large loads. This amplification is particularly critical in very large scale integrated circuits because the overhead of the interconnecting routing is so great.

FIG. 7 also shows in detail the multiplexer which controls which signals are supplied to the storage element. If the Test signal is supplied, then the storage element receives the signal from the node designated Scan Input, while if Test is not present, the storage element line 120 is coupled to the transistor array. It should be appreciated that the circuitry shown in FIG. 7 is only for the purpose of explanation. Other well known circuits may be employed as latches, multiplexers, or in place of the amplifier shown. For example, stages may be eliminated from the storage element and the amplifier for small loads.

The operation of the circuit depicted in FIG. 7 is as follows. When the test signal is asserted, transistor 100 is turned on and transistor 101 turned off to cause the scan input signal to be supplied on line 120 to the storage element. Alternatively, in normal operation, when the test signal is off, transistor 101 is on and transistor 100 off to cause the signal from the array to be supplied on line 120 to the storage element.

The dynamic storage element latches the signal presented on line 120 onto line 130. After the signal is latched on line 130, it may be supplied directly to downstream storage elements and to other transistor arrays elsewhere on the chip. In the event that the loading on line 130 exceeds the capability of the storage element, an amplifier may be provided. A typical amplifier is depicted in FIG. 7, although it will be appreciated that other amplifiers may also be employed. Ultimately, the amplified output signal is supplied on line 140 to the next storage element. If an inverted output signal is desired, a well known inverter may be driven by line 140.

FIG. 8 is a layout drawing illustrating the topology of a typical synchronous array logic circuit automatically designed using our system and circuitry. FIG. 8 includes two complete cells and a portion of a third cell, with each cell implementing a single Boolean equation. The discussion which follows relates only to the first cell associated with storage element No. 1. The other cells and storage elements provided operate in a corresponding manner. The first transistor array, designated "Array," shown in FIG. 8 implements an equation for an extended carry in a multiplier circuit. The equation is:

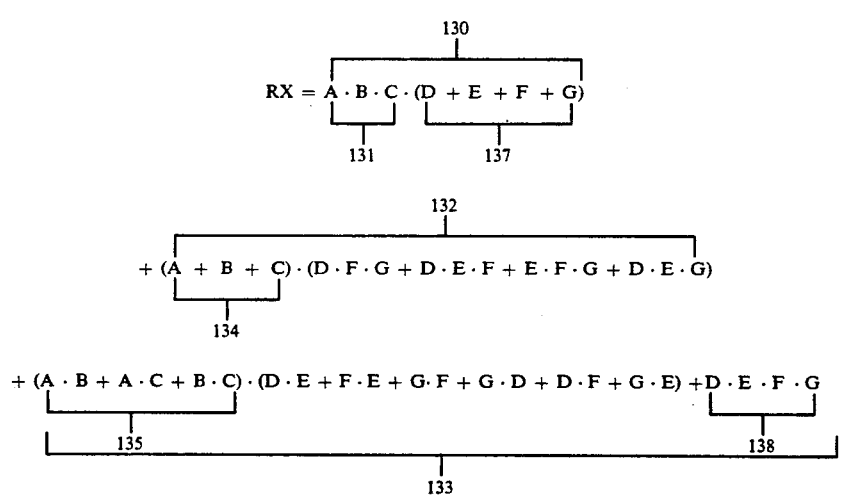

where · represents AND and + represents OR. The reference numerals 130–138 surrounding the equation relate to the corresponding numerals in FIG. 8. This equation is implemented in the part of FIG. 8 designated "Array." The array includes a series of horizontal metal lines 101, 102 . . . 107 to which signals A, B, C, D . . . G are applied. As mentioned above, signals A . . . G typically are provided by other storage elements. The array also includes a series of diffused regions such as regions 110, 111, 112 and 113. At desired intersections of the metal connections 101–107 with the diffused regions 110–113, transistors are fabricated, for example, transistors 120, 121 and 122. The transistors' sources and drains, the diffused regions connecting the sources and drains, and connections from the metal lines to the gates of the transistors implement the array logic in the manner described above. For example, the transistors within section 130 of the array implement that portion of the above equation designated 130, i.e., A and B and C (section 131) and at least one of D, E, F and G (section 137). Similarly, the transistors within section 134 implement that portion of the equation designated 134, i.e., A or B or C. The transistors within section 135 implement the logic function A and B or A and C or B and C. Similarly, the transistors in regions 132...138 implement corresponding parts of the equation RX above. Also shown in FIG. 8 are the storage element associated with the first cell, as well as other cells, a scan terminal for signal Q, a multiplexer, a clock buffer and an output stage. These sections are constructed in the manner described above.

FIG. 8 also includes a second storage element and the implementation of a second equation. It will be appreciated that as many storage elements and equations as desired may be implemented in the manner shown. A spacer region is inserted between Storage Element No. 2 and Storage Element No. 3 because the Boolean equation implemented in conjunction with the second storage element occupies more space laterally than the width of the second storage element.

What has been described above is the synchronous array logic circuitry we have developed. Our system is particularly advantageous because once the Boolean equations for the circuitry desired are defined, the integrated circuit layout is automatically produced. This is discussed below.

System Description

FIG. 9 is a flowchart illustrating the manner by which the system of our invention processes the information supplied by a user of the system to create the physical topology of the circuit implementing the desired equations. The process begins with the entry of Boolean equations. This may be achieved manually as shown by block 200, through use of a state machine 210, or by other tools 220. If manually entered, the equations may be factorized. Factorization is explained in conjunction with FIGS. 5 and 6, and is used to minimize the transistor count still further. By any of the several means, the equations are supplied to the system—typically in a form which is not the form specified by the system. This form is referred to as the "User Shorthand Format" as shown by block 230. As supplied, the equations are stored in a database in this form for later use by the designer.

At this stage, appropriate well known simulation programs may be invoked to simulate individual cells or groups of cells to verify that the equations implement the function the designer has intended and implement it with appropriate speed and power requirements. At the same time the equations are loaded, various programs may be invoked to verify the correctness of the syntax of the equations.

Once the equations are loaded into the system, they are converted to pure Boolean format as shown by block 240. This is achieved by removing the exclusive OR function (XOR), and converting each equation entirely into AND, OR and inverse operations. At this stage, the equations may remain nested or may be factored. At the same time, the equations containing "if then else" statements are converted to Boolean form and all equations are fully expanded. For example, a term in an equation which is defined using other terms in other equations will be replaced with the most fundamental terms.

Once the equations are in pure Boolean format, our system may proceed with either of two operations—reduction, if the equations were factorized, or a more encompassing form of redundancy elimination referred to herein as minimization. In reduction, all duplicate terms or transistors are removed to enable complete testability of the resulting circuit. The equations are reduced by the system deriving a truth table and then attempting to remove each transistor. The resulting truth table is then checked against the beginning truth table. If the truth tables are the same, the transistor is known to be redundant or unnecessary and may be removed. After reduction, the resulting equations are referred to herein as Boolean equations in layout format, as represented by block 250. These equations are also stored in the database.

The alternative path between the pure Boolean format and the layout format involves minimization. In the minimization process the equations are first expanded to a sum of products form, and then the transistor count is minimized by application of the Quine McCluskey algorithm. Redundant transistors are also removed in the manner described above. Once the equations are in layout format, the circuit may be laid out using our automatic cell layout software "Autocell" as shown by block 260.

Layout of Individual Cells

The automatic layout of an individual cell is a multidimensional optimization problem which involves performance, silicon area, and routability. Using our system the user is able to select the relative importance of these three factors, for example, to elect to by improve routability at the expense of silicon area. Alternatively, by minimizing area the cell may be so compacted as to be unroutable because the targets for the router are grouped too closely together.

At the time Autocell is loaded into the computer system, information is retrieved from a library regarding primitives, storage elements, clock buffers, and the technology to be employed. As large a library as desired of each will be provided to enable selection of appropriate ones. The primitives provide basic information about silicon components in the circuit layout, for example, the space occupied by a single transistor, the design rules for the circuit, etc. The storage elements have been discussed above, and in the preferred embodiment a library of various storage elements of different dimensions, amplification, etc., are available from which ones are selected depending upon the particular transistor array implemented, as well as loading of the output. Similarly, a library of clock buffers allows selection of an appropriate buffer, depending upon the load to be driven. The technology information relates to the technology by which the circuit will be implemented. In the preferred embodiment pseudo-CMOS is employed.

The storage elements may be selected from a library according to their drive capability and area aspect ratio. Alternatively, storage elements may be automatically generated from design-related information. While the automatic generation of storage elements eliminates the need for a library of storage elements, it also does not result in as compact a layout as a hand-crafted storage element.

There are various types of storage elements. The storage elements are designed such that the clock, test, scan, $V_{CC}$ and $V_{SS}$ connections connect automatically when the storage elements are abutted together in a row. A storage element may be considered as having an input node, a body, and an output node. The input node may be a normal transistor array input which allows input from an array of transistors. The input node may be a "sensitive" array input to allow input signals from a large array of transistors, or it may be a node which allows input from a foreign environment such as an off-chip signal or some other independent clock signal environment. Finally, the input node may be a direct input which allows a signal to be received from an adjacent cell. Whether a node is defined as a normal input node or a sensitive input node is determined by the size of the array. If the array is large, defined as meaning the number of OR terms times the number of transistors in the largest AND term, or the array capacitance is large, then a sensitive input node is employed.

The body of storage element may be dynamic or static, with dynamic devices preferred because of their compactness. In cases where the clock signal is asynchronous, however, static storage elements may be employed. The output node of the storage element may drive only the adjacent cell, may drive array transistors only within that cell (a feedback loop), or may drive multiple destinations external to that cell, or any combination thereof.

The clock buffer primitive is used for driving the clock signal inside a cell. The clock buffer includes an inverting test buffer and a scan input node target for the cell. A clock buffer is required for each row of cells, and there are several sizes of buffers available depending upon the loading within the cell. Other primitives include a spacer unit used to fill any gaps between storage elements, as well as vias and contacts for different types of interconnections.

The clock signal is important in scan testing. The loading of the clock and its distribution on the chip may require the clock signal to be buffered. This may be done either at cell level, by including the clock buffer at the beginning of a top row of storage elements (as shown in FIG. 8), or it may be done on an iterative basis by the global placement software.

Once the Autocell program is loaded, the next step is to order the storage elements, as shown by block 270. The placement of storage elements is a critical part of the layout because this ordering constrains the minimum height of the transistor arrays. To allow override of the system in circumstances where, for some reason, the designer wishes to determine the order of the storage elements, block 280 allows the user to specify an order for the storage elements. As shown in the flowchart if the user specifies the order, the system specification of storage element order is circumvented.

There are two basic arrangements for the cells, and the choice of arrangement is automatic, but can also be defined by the user. In the first arrangement storage elements are positioned along two parallel rows spaced apart from each other. In the space between the rows, the transistor arrays are formed to interconnect with the desired storage elements. In a single row system, a single row of storage elements is provided, for example, in the manner shown in FIG. 8.

As discussed above, there is a single storage element for each Boolean equation which the system evaluates. The storage elements additionally electrically separate each transistor array from the adjacent arrays and allow the system to be completely synchronous. This eliminates clocking problems associated with asynchronous circuits. If the circuits are laid out in the order that the equations have been written, propagation delays, clock buffer and storage element loading, and the like, may be very high. By appropriate ordering, layout line lengths may be minimized and packing density improved.

In our system the storage elements are ordered using a technique known as simulated annealing. Simulated annealing is now well known and is described, for example, in "Optimization by Simulated Annealing," by S. Kirkpatrick, C. Gelatt and M. Vecchi, *Science* (1983) 220(4598):671–680. Simulated annealing attempts to minimize the channel density of the cell. The channel density is the maximum number of interconnects which cross any vertical line in the channel. The channel density provides a lower bound on the height of the interconnect channel. The use of simulated annealing to rearrange the order in which the equations are laid out on the integrated circuit helps shorten propagation delays and lower loading.

Once the system has determined the order for the storage elements, the transistors within a given cell are assigned positions along a first axis, preferably the X-axis. This step is shown by block 290. For simple arrays the X positions for the transistors are assigned in a given cell beginning at the left and incrementing the location by one symbolic grid unit for each OR term of the equation. For example, with reference to FIG. 8, transistors 120 and 121, corresponding to the A and C terms of the equation implemented, occupy the same X position because they represent terms in the equation coupled by an AND operator. In contrast, transistor 122 represents another term of the equation which is found in another segment of the equation separated from segments 131 and 137 by an OR term. Accordingly, transistor 122 must be assigned an X position sufficiently greater than the X position assigned to transistor 120 to allow for all of the transistors in terms 131 and 137 to be implemented at lower coordinates along the X-axis.

When the total width of two arrays associated with storage elements directly adjacent one another is greater than the span of the storage elements, maximum density occurs. If adjacent arrays are also at maximum density, then spacing elements may be inserted into the row of storage elements, for example, as shown in FIG. 8, to provide additional space for the arrays. If adjacent arrays are not at maximum density, then the desired array may encroach into the neighboring array space. Alternatively, storage elements with the same functionality but a different area aspect ratio may be reselected from the library.

After the X positions have been assigned, the transistor Y positions are assigned as shown by block 300. In this step conventional channel routing and connection software is used. This software typically employs well known vertical constraint graphs and uses a bipartite graph for merging signal operations. The goal of the software is to compact the Y dimension of the channel, in which the transistors associated with the terms of the Boolean equations are positioned, as much as possible. In the assignment of Y positions, signals are merged onto the same horizontal track wherever possible Furthermore, compaction of the interconnect channel minimizes capacitance. Various connections can lead to vertical constraints on some of the line segments, while other constraints are introduced when laying out factorized equations. Channel routing algorithms are described in "Efficient Algorithms for Channel Routing," by T. Yoshimura and E. Kuh, *IEEE Transactions on Computer-Aided Design of Integrated Circuits and Systems* (1982) CAD-1(1):25–35.

Once the channel has been compacted, the diffusion path is laid out. Given the transistor positions and the Boolean equation tree read from the database, the diffusion path is closely specified. The software maintains desired design rules in separating the diffusion paths from itself. In laying out the diffusion path, the length of the diffusion path is minimized to reduce capacitance. Once the diffusion path is laid out as shown in step 310, a SPICE file may be output for use by well known simulation programs to evaluate the performance of the array as it is presently defined. For the vast majority of cells, a SPICE simulation is not necessary and the estimates of performance given by the system are sufficient. In select cases, however, the designer may be interested in a detailed behavior of a particular array, and a SPICE simulation may be employed for that array.

After the diffusion path layout 310, the precharge and evaluation transistors and the storage element interconnections (Q and $\overline{Q}$) are laid out as shown by step 320. This is accomplished using conventional river routing techniques. The precharge and evaluation transistors have been discussed above, and are the transistors coupling the array to appropriate potential sources. The Q connections are shown in FIG. 1 and serve to interconnect each storage element with the next storage element downstream, as well as providing connections to the input nodes of the various arrays.

The storage elements use first layer metal as do the array transistor interconnections, and therefore the rows of storage elements form an obstruction to first layer metal for the router. The router, however, can route second layer metal over the storage elements. Conventional routers for a two-layer metal processes use one metal layer for line segments in one direction and the other metal layer for line segments in a perpendicular direction. To suit this solution, the automatic layout software uses first layer metal for horizontal segments and second layer metal for vertical segments. Within a given cell, however, as many connections as possible are made by using diffusions or polycrystalline silicon. (In the preferred embodiment self-aligned silicon gate MOS devices are used in the arrays.) This minimizes the number of obstructions to the router which is only obstructed by metal, while the interconnect channel within a cell may be traversed by first and second layer metal allowing router targets to be approached from all sides of the cell.

External inputs to the cell and external outputs are flagged as targets for the router, and the automatic layout of cells places these targets. The targets for external outputs will always be placed within the storage element, and their position is largely determined by the internal design of the storage element. The targets for the input signals, however, must be placed on the interconnect field with care. For example, because the router can only cross the storage elements using vertical second layer metal, the input targets must be staggered horizontally.

Because many signals are the inverse of other signals, for example, Q and $\overline{Q}$, congestion may be avoided by routing only one signal around the chip and using local inverters to invert that signal when it reaches the destination. If enough inverted signals are required in many separated destinations, however, the overhead of the extra inverters may outweigh the benefits to the router.

During routing, targets 330 are assigned for the second layer metal interconnection system. The second layer metal connects to these targets through vias in an intervening isolation layer. An example of the use of second layer metal is the strap 140 in FIG. 8 which connects from the evaluation node back to the output buffer.

At this stage all of the circuit is defined, and all that remains is to assign physical coordinates to the abstract information in the database. The connectivity based symbolic representation of the layout is frozen to a file. Well known software processes this representation and generates different output forms as desired. For example, the cell may be graphically described in APL language as used by Applicon systems, a subsidiary of Schlumberger, Ltd. Importantly, the representation of the cell is independent of any specific graphics descriptive language. This step is accomplished at block 340, and relies upon the specified design rules given the system with regard to the dimensions of each component.

At this stage of the system, all cells have been completely defined. As shown by block 350 in FIG. 9, all cells are then placed on the chip and the entire chip routed to interconnect the cells in the desired manner. This is achieved using conventional computer-aided design software. A typical routing system is described in "TimberWolf3.2: A New Standard Cell Placement and Global Routing Package," by C. Sechen and A. Sangiovanni-Vincentelli, *Proceedings of the 23rd IEEE Design Automation Conference*, Paper No. 26.1, pp. 432–433.

The input data to this phase of the design consists of chip level information (a global net list, technology, and layout rules), as well as cell information. Before layout the chip level net list will have passed through a program which checks to be sure that all rules are complied with and that the net list is consistent. The area of the chip is constrained, depending upon the design, by the periphery cells associated with the bonding pads and used for buffering signals supplied from off the integrated circuit, or by the size of the core area. The core area includes the cells and routing overhead. Within the area and bonding pad position constraints, the chip may be any desired rectangle. The periphery cells consist of input/output pads and buffer circuits. For circuits having large amount of I/0, the area required for the periphery cells will constrain the design, while for circuits with less I/0, but complex functionality, the core area will constrain the chip area.

Placement of the core cells is performed initially using a partitioning approach. Partitioning is performed by taking account of connectivity, area, positions of fixed cells, and positions of cells outside the current partition. The critical nets are given a weighting such that they represent normal nets. This biases the partitioning to cluster the components in the critical net. The relative placement produced then has to be coordinated with routing and shape requirements. To do this the relative placement is mapped into a data structure where cells and intercellular space both exist as tiles which have local knowledge of their immediate neighbors. This data structure provides the flexibility to manipulate the cells so that modifications produce a pronounced effect on neighboring cells but disturb distant cells as little as possible. An interactive placement facility is provided to permit a designer to manually alter the positioning of various cells or groups of cells.

In routing a two-pass router is employed. First, the well known "Hightower" algorithm is employed. The remaining, more difficult, nets are then routed using a maze routing algorithm, such as Lee's algorithm.

The scan test capability is provided by the storage elements and the software only needs ensure that all storage elements are connected into a scan path and that the scan input and scan output points are made available to the global layout software.

One of the basic concepts of our invention is that the designer should not have to concern him- or herself with testability. To achieve this, test features are automatically built into circuits designed using our system. For normal cells, the built in scan paths may be connected as a shift register when the test-mode signal is applied (on line 27 in FIG. 1). Test data may then be shifted into the chip, and when all of the shift registers are full, the chip is returned to a normal mode for one clock cycle. All of the Boolean logic arrays are evaluated and the results placed into the storage elements. When the test signal is asserted again, the results may be shifted out of the chip at the same time as new test data is being shifted in. These actual test results may then be compared with the predicted test results of a properly functional circuit.

Although all the cells with the same clock signal may be regarded as belonging to the same scan chain, the scan chain may be split into subchains to allow patterns to be shifted in and out which are shorter and to allow the use of parallel data paths found on most automatic test equipment. The choice of subchains involves, for example, replacing an ordinary output buffer with one which is preceded by a multiplexer under control of the test line. Should the chip contain nonsynchronous array logic cells, for example, manually generated circuits or circuits chosen from other chips, extra logic may be added to make that portion of the chip testable.

Lastly, test vectors are automatically generated for use in testing the circuit. This is shown by block 360. The test vectors are generated by reading in data regarding all of the scan chains in the finished chip, that is, a string of storage elements and arrays resulting in an output signal. The first test vector generated is an individual shift test to verify that the entire scan path is present and to verify the absence of shorts between Q and $\overline{Q}$. This is achieved by a "walking" 1 or "walking" 0 test in which a pattern is generated for a single 1 or single 0 scanned through the chain. Then a pattern is generated which tests all scan paths together to verify that there are no shorts to any other scan chains from the desired scan chain.

Finally, test vectors are generated to test for stuck open and stuck closed transistors, as well as breaks in the buried diffusion. This is achieved by generating a test which attempts to turn on each transistor. The Boolean equation description of a cell may be used in conjunction with the design database to form individual tests for each transistor in the array attached to each storage element. The individual array tests are formed by making each path through the transistor array conduct in isolation and then selectively switching off that path to test each transistor in turn. Once test patterns are determined for each cell, they may be merged to produce a complete test for the chip. For example, for a test pattern to turn a given transistor on, all desired setup values are clocked into the necessary storage elements which supply the array inputs relevant to the given transistor using the storage elements connected in shift register mode via the test line. Then the pattern switches the circuit into normal mode, thereby causing the array to evaluate. The functionality of the desired transistor is verified when the storage element coupled to that array is confirmed to have the correct signal, again after clocking out with the storage elements in shift register mode via the test line. Finally, the test vectors are compacted by examining the input and output data to determine if more than one test is valid for one set of input data.

The foregoing has been a description of the system and circuitry for a preferred embodiment of our invention. This description is intended to illustrate the invention and explain its operation. The scope of the invention is given by the appended claims.

We claim:

1. A circuit comprising:
    a source of clock signals;
    a first scan node, a second scan node, and a third scan node;
    a test node for supplying a test signal;
    a first transistor array for evaluating a set of signals, the first array having at least one first input node and a first output node;
    a second transistor array having at least one second input node and a second output node;
    a first storage element connected to receive the clock signals and connected to the second scan node;
    a second storage element connected to receive the clock signals and connected to the third scan node;
    first switching means connected to the test node, the first scan node, the first output node, and the first storage element for connecting one of the first scan node or the first output node to the first storage element under control of the test signal; and
    second switching means connected to the test node, the second scan node, the second output node, and the second storage element for connecting one of the second scan node or the second output node to the second storage element.

2. A circuit as recited in claim 1 wherein the first transistor array comprises:
    a first source and a second source of electrical potential;
    an array of transistors for evaluating a Boolean function;
    precharging means connected between the first source and the array; and
    evaluation means connected between the second source and the array, wherein the first source is connected to the second source when a conductive path exists through the array.

3. A circuit as recited in claim 2 wherein the source of clock signals is coupled to each of the precharging means and the evaluation means.

4. A circuit as recited in claim 2 wherein each transistor in the array has a control gate; and
    all transistors in the array corresponding to a same term in the Boolean function have commonly connected control gates.

5. A circuit as recited in claim 1 wherein the first storage element comprises a latch.

6. A circuit as recited in claim 1 wherein switching means comprises a multiplexer.

7. A circuit as recited in claim 1 wherein the first transistor array comprises a plurality of transistors connected to implement a Boolean function.

8. A circuit as recited in claim 7 wherein the array is further characterized by:
ones of the plurality of transistors for implementing AND functions being serially connected; and
ones of, the plurality of transistors for implementing OR functions being parallel connected.

9. A circuit as recited in claim 1 wherein the array comprises a plurality of transistors connected in an AND-OR matrix.

10. A circuit as recited in claim 9 wherein transistors performing an AND function are serially connected.

11. A circuit as recited in claim 9 wherein transistors performing an OR function are parallel connected.

12. A circuit as recited in claim 1 wherein the array of transistors comprise field effect transistors, each having a gate and a pair of diffused regions selectively connectable to each other by application of signals to the gate.

13. A circuit as recited in claim 12 wherein the array of transistors implements a Boolean equation having terms connected only by AND and OR operators, and wherein the array includes a transistor corresponding to each term of the equation.

14. A circuit as recited in claim 13 wherein the array of transistors corresponding to the same term are commonly connected.

15. A circuit as recited in claim 14 wherein the diffused regions of transistors corresponding to terms of the equation coupled by AND operators are serially connected and the diffused regions of transistors corresponding to terms of the equation coupled by OR operators are parallel connected.

16. A circuit comprising:
a test node;
a clock node;
a scan input node;
a scan output node;
an array of transistors connected in an AND-OR matrix to perform a specific function, the transistors performing an AND function being serially connected, and the transistors performing an OR function being parallel connected;
a storage element connected to the clock node and to the scan output node; and
switching means connected to the test node, the scan input node, the array, and the storage element and operable under control of the test node for supplying signals from one of the scan input nodes or the array to the storage element, and wherein the array comprises,
a first and a second potential source;
a plurality of transistors connected between a first node and a second node to perform a Boolean function, each transistor having a control electrode;
control means connected to each of the control electrodes for supplying control signals;
charging means connected between the first potential source and the first node; and
evaluation means connected between the second node and the second potential source for controllably connecting them together.

17. A circuit as recited in claim 16 wherein the array of comprises:
a first and a second potential source;
a plurality of transistors connected between a first node and a second node to perform a Boolean function, each transistor having a control electrode;
control means connected to each of the control electrodes for supplying control signals;
charging means connected between the first potential source and the first node; and
evaluation means connected between the second node and the second potential source for controllably connecting them together.
evaluation means connected between the second node and the second potential source for controllably connecting them together.

18. A circuit as recited in claim 16 wherein charging means comprises a charging transistor having a control electrode connected to the source of clock signals.

19. A circuit as recited in claim 18 wherein the evaluation means comprises an evaluation transistor having a control electrode connected to the clock node.

20. A circuit as recited in claim 19 wherein the switching means is connected to the array at the first node.

21. A circuit as recited in claim 16 wherein the control electrodes for all transistors receiving a same control signal are commonly connected.

22. A circuit as recited in claim 16 wherein the array of transistors comprise field effect transistors, each having a gate and a pair of diffused regions selectively connectable to each other by application of signals to the gate.

23. A circuit as recited in claim 22 wherein the array of transistors implements a Boolean equation having terms connected only by AND and OR operators, and wherein the array includes a transistor corresponding to each term of the equation.

24. A circuit as recited in claim 23 wherein the gates of all transistors corresponding to the same term are commonly connected.

25. A circuit as recited in claim 24 wherein the diffused regions of transistors corresponding to terms of the equation coupled by AND operators are serially connected and the diffused regions of transistors corresponding to terms of the equation coupled by OR operators are parallel connected.

* * * * *